United States Patent [19]

Taylor

[11] 4,400,257

[45] Aug. 23, 1983

[54] METHOD OF FORMING METAL LINES

[75] Inventor: Gordon C. Taylor, Princeton, N.J.

[73] Assignee: RCA Corporation, New York, N.Y.

[21] Appl. No.: 451,818

[22] Filed: Dec. 21, 1982

[51] Int. Cl.³ .............................................. C23C 15/00
[52] U.S. Cl. ................................. 204/192 E; 156/643;
204/192 EC; 204/192 C
[58] Field of Search .................... 156/643; 204/192 E,
204/192 EC, 192 C

[56] References Cited

U.S. PATENT DOCUMENTS

| | | | |
|---|---|---|---|
| 4,048,712 | 9/1977 | Buiatti | 29/571 |
| 4,145,459 | 3/1979 | Goel | 156/643 |
| 4,272,561 | 6/1981 | Rothman et al. | 156/643 |
| 4,312,113 | 1/1982 | Calviello | 29/571 |
| 4,325,181 | 4/1982 | Yoder | 29/571 |
| 4,352,716 | 10/1982 | Schaible et al. | 156/643 |
| 4,362,597 | 12/1982 | Fraser et al. | 204/192 E |

OTHER PUBLICATIONS

"Masking for Ion Beam Etching" P. G. Gloersen; Solid State Technology, Apr. 1976, pp. 68–73.
"Microfabrication by Ion-Beam Etching" R. E. Lee; J. Vac. Sci. Tech., vol. 16, No. 2, Mar./Apr. 1979.

*Primary Examiner*—Arthur P. Demers
*Attorney, Agent, or Firm*—Birgit E. Morris; Donald S. Cohen; Lawrence P. Benjamin

[57] ABSTRACT

A method of forming metal lines is described for semiconductor processing wherein a line mask is initially ion milled to provide a mask contour which promotes the onset of chemical etching at the base of the mask. This produces a metal line that has a tapered cross-sectional dimension wherein the base of the line is narrower than the top.

7 Claims, 7 Drawing Figures

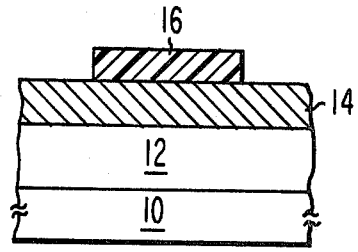
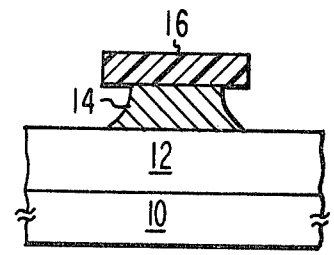
Fig. 1a    PRIOR ART    Fig. 1b
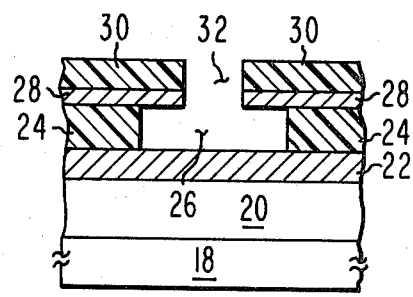
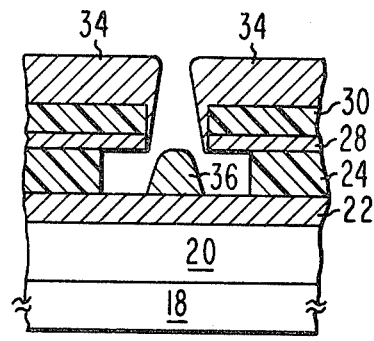
Fig. 2    Fig. 3
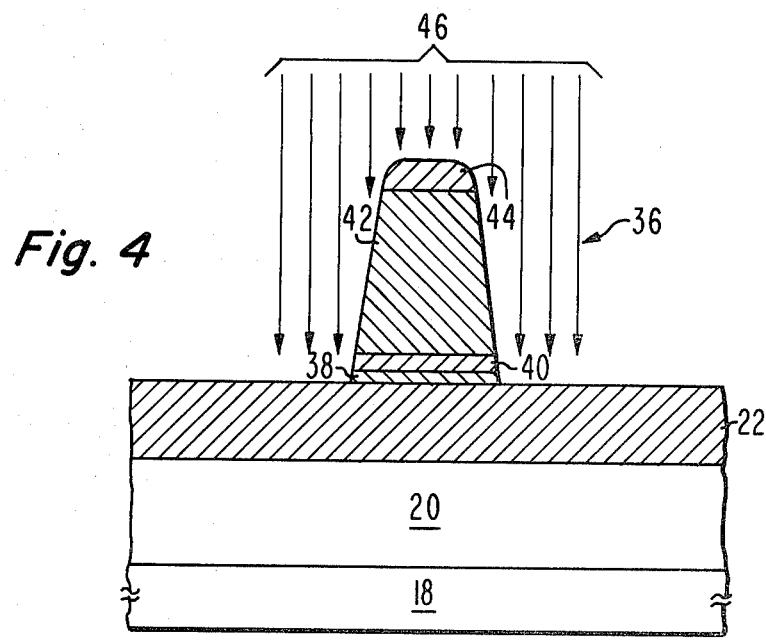
Fig. 4

METHOD OF FORMING METAL LINES

The Government has rights in this invention pursuant to a Government contract.

BACKGROUND OF THE INVENTION

This invention relates to semiconductor processing and, more particulary, to a method of controlling the edge profile of chemically etched metal lines.

The natural tendency of a chemical etching step, when it is necessary to form fine line metal structures, is to produce a structure which, in cross section, is narrower at the top and wider at the bottom. This characteristic is due to the essentially isotropic nature of the chemical etching process. Such a process is illustrated in FIGS. 1a and 1b where a metal layer to be etched 14 is formed on substrates 10 and 12. These substrates may, for example, be a substrate 10 of undoped Gallium Arsenide (GaAs) and a layer 12 of doped GaAs. Metal layer 14 is covered by a photoresist mask 16 whereby the portion of layer 14 under mask 16 defines the gate member. Assuming perfect adhesion of the masking layer, it should be noted that if the etching process were to continue to the point where the upper surface of layer 12 is exposed, layer 14 would be undercut under mask layer 16. Further, it would be seen that the narrower part of the etched metal line is that portion of layer 14 in contact with layer 16 as shown in FIG. 1b.

In defining the gatelength in a Schottky barrier Field Effect Transistor, one would prefer to have the narrower part of the etched metal line in direct contact with the doped GaAs layer rather than at the top. The gatelength being defined as the width of the metal line in contact with the doped GaAs layer 12.

SUMMARY OF THE INVENTION

In the subject application, the process described achieves the desired result of producing an etched metal line that is narrower at the bottom, where it contacts the underlying layer, rather than at the top as produced by the prior art. The process of the subject application achieves this result by making use of a metal masking layer combined with the resultant redeposition and trenching effects of ion beam milling prior to the use of a chemical etch.

BRIEF DESCRIPTION OF THE DRAWINGS

FIGS. 1a and 1b is a cross-sectional, elevation view of the results of a prior art chemical etching; and FIGS. 2–6, inclusive, represent cross-sectional, elevation views of the process of the subject invention indicating the resultant structure during the processing for forming a conductive line that is narrower at the bottom than at the top.

DETAILED DESCRIPTION OF THE INVENTION

Figure 5:
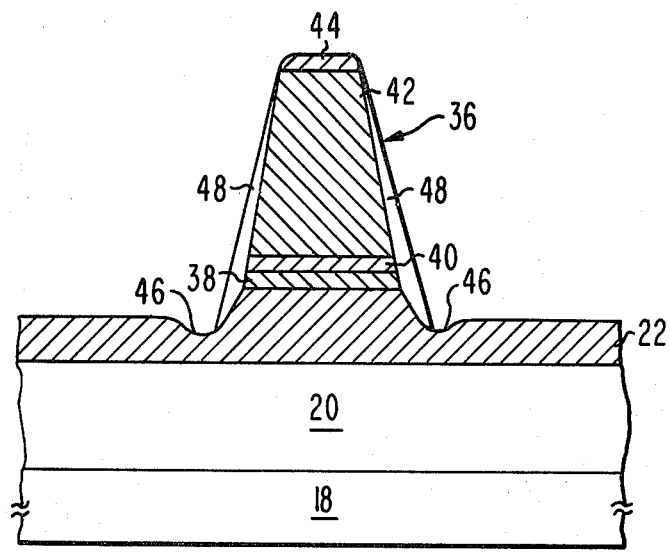

In the following description it should be noted that similar elements in the various FIGURES will be similarly numbered.

Referring now to FIG. 2 there is shown an undoped layer 18 of, for example, GaAs having a layer 20 of doped GaAs formed thereon. This is followed by a layer 22 of a metal which may be, for example, titanium having a thickness of about 0.55 microns ($\mu$m) deposited uniformly across doped GaAs layer 20. This is followed by a layer of photoresist 24 having a thickness of about 1.5 microns that is deposited on titanium layer 22. This layer of photoresist 24 may be spun on in a well known fashion, pre-baked and followed by an exposure to light in the area that will subsequently create aperture 26, as will be explained later. The photoresist layer 24 does not have the exposed portions removed at this time but instead, has a thin layer of titanium 28, about 0.01 microns thick, applied to the exposed surface of layer 24. A second layer of photoresist 30, having a thickness of about 1 micron is now spun on the top surface of layer 28 and exposed in the area where aperture 32 will be formed. This aperture is about 1 micron wide. At this point, the exposed portion of photoresist layer 30 is removed to form aperture 32 and this is used as a mask to form a similar aperture, of the same dimension in the thin metal layer 28. This may be done by using a solution of $H_2O:HF:HNO_3$ in the volume ratio of about 50:1:1. Thereafter, the previously exposed portion of photoresist layer 24 is removed to form aperture 26 having a width of about 3.0 microns.

Referring now to FIG. 3 it will be seen that after the formation of apertures 32 and 26, a multi-metal layer 34 is formed on the top surface photoresist layer 30. During the formation of layer 34, line mask 36 is formed in aperture 26. Mask 36, having the same plural layers as layer 34, has a nominal width of about 1 micron at its base which dimension is determined by aperture 32. Etch mask 36 consists of a first layer of titanium 38 having a thickness of about 0.1 microns, a layer of platinum 40 having a thickness of about 0.1 micron, a layer of gold 42 of about 1.8 microns thick followed by a 0.4 micron thick layer of titanium 44.

Referring now to FIG. 4 there is shown an enlarged, sectional view of the line mask 36, in order to show, in greater detail the plural layers that constitute both layer 34 and mask 36. After the formation of mask 36, the structure is subjected to a photoresist lift-off step at which time photoresist layers 24 and 30 are dissolved and fall away or are otherwise removed to form the structure shown in FIG. 4. The structure is then subjected to an ion beam milling process step, as indicated by arrows 46. Typical operating conditions during the milling stage may be as follows:

| | |
|---|---|
| Accelerating voltage | 500 volts |
| Argon pressure | $8 \times 10^5$ Torr. |
| Beam current | 20 ma |
| Suppressor Grid | 250 volts |
| Beam area | 19.5 cm$^2$ |
| Incident beam | normal to substrate surface |
| Time | about 30 minutes |

The result of the ion beam milling is shown in FIG. 5 wherein the ion milled structure produces a mask 36 which is somewhat shorter than the original mask shown in FIG. 4 due to the ion milling of layer 44. In addition, the ion milling of the structure of FIG. 4 produces trench areas 46 on both sides of mask 36 as well as side-wing portions 48 both of which extend along the length of mask 36. These side-wings 48 consist primarily of redeposited gold and titanium and are unetchable by the titanium etchant. This redeposition formation is well known in the art of ion beam milling and, until utilized here, has been an undesirable effect. However, since the side-wings 48 are redeposited gold, which is not attacked by the chemical etchant used to etch the titanium layers 22, 38 and 44, its presence in the process of the subject application is now desired.

Figure 6:
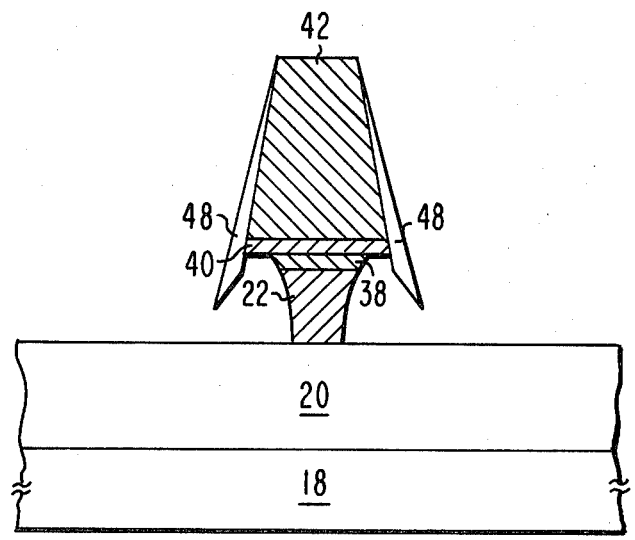

At this point, the structure is subjected to a dilute titanium etchant, consisting of $H_2O:HF:HNO_3$ mixed in a volume ratio of about 130:1:1, for about 2½ minutes to produce the structure shown in FIG. 6. The side-wings 48 attached to gold layer 42 serve to channel the etchant and cause it to first attack layer 22 in the region under the lowest lip of side-wings 48. Once the attack has begun it proceeds with a circular wave front. The net effect is to produce a structure having a narrow base portion in contact with layer 20 and a wider upper portion in contact with platinum layer 40. The etch is continued until such time as the surface of layer 20 is exposed and continues until such time as layer 22 has acquired the required dimensions.

In the case of a Schottky barrier gate for an FET it would be desirable to allow the newly formed structure 36 to remain in place as this would result in a lower value of gate metal resistance. Since no contact will be made directly to this structure, but instead, to a pad (not shown) at the end of this metal masking layer, no undesirable effects will be introduced by allowing the structure to retain its shape. However, if it is desired to remove a portion of this layer the removal can be accomplished, for example, by chemical etching provided that the etchant does not attack either layer 20, 22 or 38. An alternative would be to replace layer 40 (platinum in the example shown) with a metal that can be more easily etched without attacking layers 20, 22 or 38.

What is claimed is:

1. A process for forming a conductive line on a substrate, comprising steps of:
    forming a conductive layer on the substrate;
    forming an apertured masking layer on the conductive layer, the aperture having a first dimension at the surface of the masking layer adjacent the conductive layer and a narrower dimension at its opposite surface;
    depositing a line masking layer on the exposed surface of the metal layer;
    removing the apertured masking layer;
    ion milling the line masking layer and the exposed portions of the conductive layer for a period of time sufficient to form trenches on either side of the line masking layer and to simultaneously redeposit a portion of the line masking material and the conductive layer on the sides of the line masking material to form projecting wings thereon; and
    chemically etching the exposed conductive layer and a portion of the conductive layer under the line masking layer.

2. The process of claim 1, wherein the step of forming an apertured masking layer comprises:
    forming a first layer of masking material on the conductive layer;
    exposing a portion of the first layer to delineate a first area which will represent a first aperture;
    forming a second layer of masking material on the first layer;
    forming a third layer of masking material on the second layer;
    exposing a portion of the third layer to delineate another area which will represent a second aperture in alignment with the first aperture;
    developing and removing the second delineated area in the third layer to form an aperture and to expose portions of the second layer of masking material;
    removing the exposed portion of the second masking layer to form an aperture and to expose the first delineated area; and
    removing the exposed portion of the first delineated area to form an aperture in the first masking layer.

3. The process of claim 2, wherein:
    the first and third layers of masking material are layers of photoresist;
    the first layer being deposited to a thickness of about 1.5 microns;
    the third layer being deposited to a thickness of about 1.0 microns; and
    the second layer of masking material is a metal layer deposited to a thickness of about 0.01 microns.

4. The process of claim 3, wherein the step of depositing a line masking layer, comprises:
    depositing successive metal layers;
    depositing the first and second layers to a thickness of about 0.1 microns;
    depositing a third layer to a thickness of 1.8 microns; and
    depositing a fourth layer to a thickness of about 0.4 microns.

5. The process of claim 4, wherein:
    the conductive layer is titanium;
    the first and fourth metal layer of the line masking layer are titanium;
    the second metal layer of the line masking layer is platinum; and
    the third metal layer of the line masking layer is gold.

6. The process of claim 5, wherein:
    the ion milling step is maintained at:

| | |
|---|---|
| Accelerating voltage | 500v |
| Ambient pressure | $8 \times 10^5$ Torr. |
| Beam current | 20 ma |
| Suppressor grid | 250v |

7. The process of claim 6, wherein the ion milling step comprises:
    maintaining the substrate normal to the incident beam of ions; and
    maintaining the substrate in the ion beam for a period of about 30 minutes.

* * * * *